United States Patent
Sangaunwong et al.

(10) Patent No.: US 7,656,173 B1
(45) Date of Patent: Feb. 2, 2010

(54) STRIP SOCKET HAVING A RECESSED PORTIONS IN THE BASE TO ACCEPT BOTTOM SURFACE OF PACKAGED SEMICONDUCTOR DEVICES MOUNTED ON A LEADFRAME FOR TESTING AND BURN-IN

(75) Inventors: Saruch Sangaunwong, Bangsaothong Samutprakarn (TH); Prayoch Tayaphat, Nakhonpathom (TH); Pinut Boonareeroj, Nakhonpathom (TH)

(73) Assignee: UTAC Thai Limited, Bangna, Bangkok (TH)

( * ) Notice: Subject to any disclaimer, the term of this patent is extended or adjusted under 35 U.S.C. 154(b) by 0 days.

(21) Appl. No.: 11/413,408

(22) Filed: Apr. 27, 2006

(51) Int. Cl.
*G01R 1/04* (2006.01)
(52) U.S. Cl. ...................... 324/754; 324/755
(58) Field of Classification Search ............... 324/537, 324/754, 760, 158.1; 437/207
See application file for complete search history.

(56) References Cited

U.S. PATENT DOCUMENTS

| | | | | |
|---|---|---|---|---|
| 3,611,061 | A * | 10/1971 | Segerson | 257/667 |
| 4,411,719 | A * | 10/1983 | Lindberg | 156/64 |
| 4,713,611 | A * | 12/1987 | Solstad et al. | 324/760 |
| 4,757,255 | A | 7/1988 | Margozzi | |
| 4,766,371 | A * | 8/1988 | Moriya | 324/763 |
| 4,779,047 | A * | 10/1988 | Solstad et al. | 324/760 |
| 4,801,561 | A * | 1/1989 | Sankhagowit | 29/827 |
| 4,855,672 | A * | 8/1989 | Shreeve | 324/760 |
| 4,871,965 | A | 10/1989 | Elbert et al. | |
| 5,006,792 | A | 4/1991 | Malhi et al. | |
| 5,008,615 | A * | 4/1991 | Littlebury | 324/754 |
| 5,142,449 | A * | 8/1992 | Littlebury et al. | 361/782 |
| 5,247,248 | A * | 9/1993 | Fukunaga | 324/760 |
| 5,248,075 | A * | 9/1993 | Young et al. | 228/5.1 |
| 5,396,185 | A * | 3/1995 | Honma et al. | 324/754 |
| 5,479,105 | A * | 12/1995 | Kim et al. | 324/755 |
| 5,548,884 | A | 8/1996 | Kim | |
| 5,578,919 | A * | 11/1996 | Semba et al. | 324/158.1 |
| 5,666,064 | A * | 9/1997 | Kasai et al. | 324/755 |
| 5,990,692 | A * | 11/1999 | Jeong et al. | 324/755 |
| 6,072,239 | A | 6/2000 | Yoneda et al. | |
| 6,159,770 | A | 12/2000 | Tetaka et al. | |
| 6,229,325 | B1 | 5/2001 | Browning et al. | |
| 6,304,000 | B1 * | 10/2001 | Isshiki et al. | 257/782 |

(Continued)

OTHER PUBLICATIONS

Non-Final Office Action dated Jun. 5, 2008, U.S. Appl. No. 12/080,677, filed Apr. 4, 2008.

(Continued)

*Primary Examiner*—Paresh Patel
(74) *Attorney, Agent, or Firm*—Haverstock & Owens LLP

(57) ABSTRACT

A method and apparatus are provided for using a strip socket in testing or burn-in of semiconductor devices in a strip. In one example of the method, processing of semiconductor devices involves assembling the semiconductor devices into a strip, isolating a portion of each of the semiconductor devices of the strip, and performing operations on the strip using a strip socket, wherein the strip socket is designed to make electrical contact substantially simultaneously with each semiconductor device in the strip.

6 Claims, 7 Drawing Sheets

U.S. PATENT DOCUMENTS

| | | |
|---|---|---|
| 6,329,711 B1 | 12/2001 | Kawahara et al. |
| 6,376,921 B1 | 4/2002 | Yoneda et al. |
| 6,392,427 B1 * | 5/2002 | Yang .......................... 324/755 |
| 6,552,560 B2 | 4/2003 | Melgaard et al. |
| 6,573,121 B2 | 6/2003 | Yoneda et al. |
| 6,709,877 B2 * | 3/2004 | Tsui et al. ..................... 438/14 |
| 7,008,825 B1 * | 3/2006 | Bancod et al. .............. 438/123 |

OTHER PUBLICATIONS

Non-Final Office Action dated Jun. 2, 2009, U.S. Appl. No. 12/080,676, filed Apr. 4, 2008.

Final Office Action dated Sep. 3, 2009, U.S. Appl. No. 12/080,676, filed Apr. 4, 2008, Sangaunwong et al.

* cited by examiner

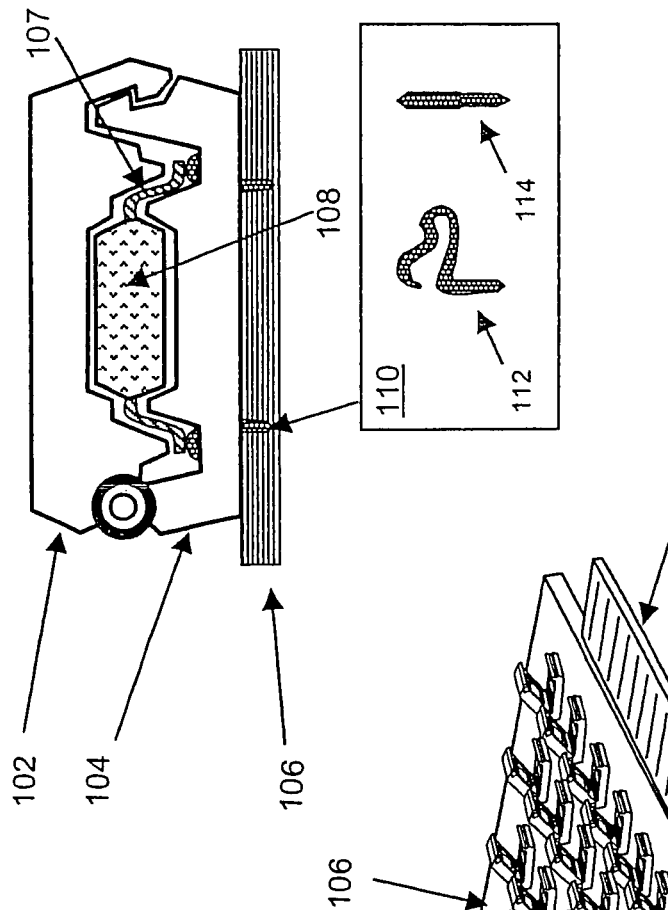
FIG. 1B (PRIOR ART)
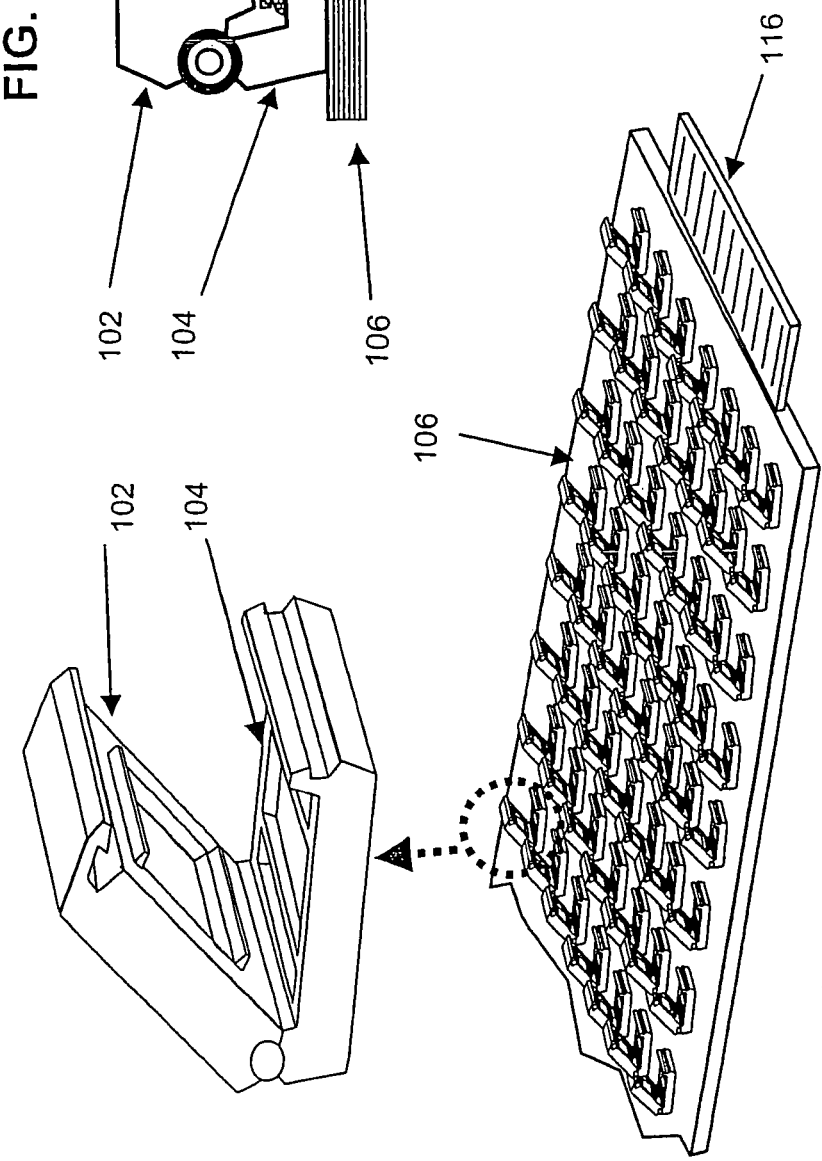
FIG. 1A (PRIOR ART)
FIG. 1C (PRIOR ART)

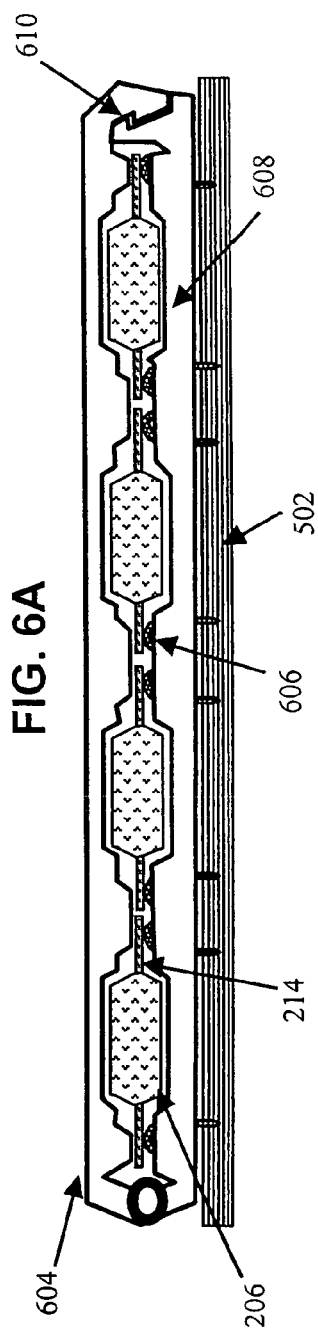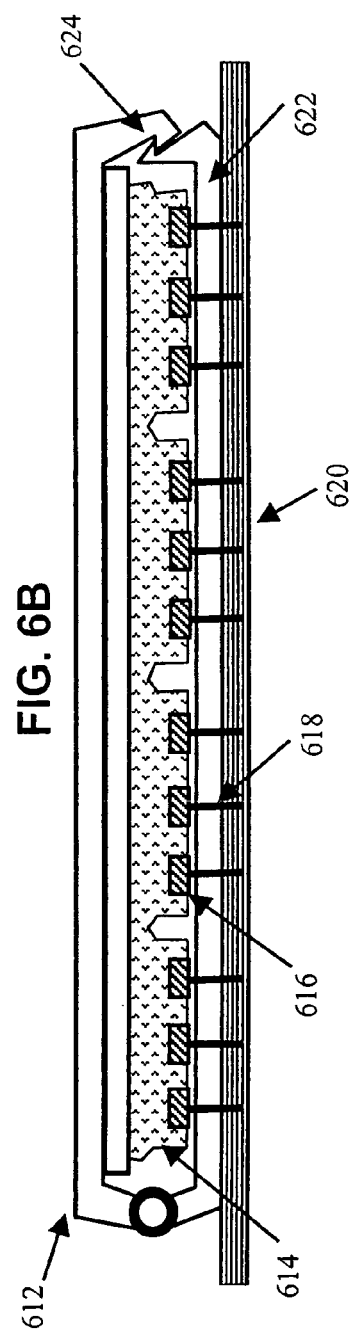

STRIP SOCKET HAVING A RECESSED PORTIONS IN THE BASE TO ACCEPT BOTTOM SURFACE OF PACKAGED SEMICONDUCTOR DEVICES MOUNTED ON A LEADFRAME FOR TESTING AND BURN-IN

FIELD OF THE INVENTION

The present invention relates to semiconductor devices. More particularly, the present invention relates to parallel testing and burn-in of semiconductor devices in a strip socket.

BACKGROUND OF THE INVENTION

A semiconductor wafer is a thin, round slice of semiconductor material, typically silicon, on which microchips are made. Manufacturers process silicon into large cylindrical masses of metal, slice the masses into wafers and then form transistors and other elements on the wafer before cutting the wafers into smaller semiconductor chips. A higher density of these semiconductor chips on the wafers is desirable for cost savings and productivity improvement. Chip manufacturers have made steady improvements in shrinking die size (i.e., chip size) and expanding wafer size. Manufacturers have also given more rows and columns to the lead frame matrix in assembly processes.

As is known, a number of semiconductor chips will fail after a relatively short period of operation. Such a failure is termed in the field as infant mortality. Semiconductor chips are subjected to heat and electric signals to cause infant mortality failures. The remaining semiconductor chips will exhibit improved reliability. Semiconductor devices must undergo a process commonly known as final testing. Final testing is the final process of an electrical testing of a semiconductor device. The final process involves using an automatic test handler, test contact and tester. The semiconductor chips are inserted into sockets. This provides easier handling and handling of multiple semiconductor chips with a single touch. However, the strip format or strip base package cannot perform other testing, such as burn-in or signal cycling (e.g., read/write endurance testing).

FIG. 1A (Prior Art) is a conventional test/burn-in socket for a singulated semiconductor package. A singulated package is a unit semiconductor device which was assembled into a strip leadframe and then singulated out of lead frame into a single semiconductor chip. The test/burn-in socket includes a cover 102 and a base 104. The socket can also be used without a cover 102. A conventional test typically involves a test method used in conjunction with an automated handler which handles the semiconductor package which has already been singulated. Appropriate electronic signals are coupled to the semiconductor device to determine whether it is operational with predetermined specifications.

FIG. 1B (Prior Art) is a cross-sectional view of the conventional test/burn-in socket of FIG. 1A (Prior Art). The socket commonly has a socket body designed to accommodate a singulated semiconductor package 108. Electrical contacts of the package 108 are in electrical contact with corresponding electrical contacts of the socket body. The package 108 is under test in the test/burn-in socket.

In this singulated package 108, a lead 107 is formed into an appropriate shape. The base 104 of the socket is secured to the printed circuit board (PCB) 106 with contact pins 110. Numerous contact pins 110 contact the lead 107 or terminal of the package 108 for establishing an electrical connection between the PCB 106 and the package 108. Examples of a contact pin include a stamped pin 112 and a pogo pin 114.

FIG. 1C (Prior Art) is a conventional test/burn-in board, including multiple test or burn-in sockets. The test/burn-in board includes multiple sockets mounted on a PCB 106. A card edge connector 116 is integrally formed with the PCB 106. The card edge connector 116 is integrally for connecting the test/burn-in board to a test/burn-in system.

FIG. 7A (Prior Art) is a flowchart of an exemplary conventional testing/burn-in process. The process flow begins in operation 702 which includes assembly of semiconductor chips into packages. Assembly includes die attachment, wire bonding, plating and molding. The process flow proceeds to the operation 704 which includes forming the lead frame and singulation of the packages. Next, test/burn-in of singulated sockets is performed in the operation 706. In the operation 708, final testing is performed. Then, in operation 710, the devices which pass final testing are packed for shipping. As shown in FIG. 7A, only the operations 702 and 704 involve handling the packages as lead frames or strips. Operations 706, 708 and 710 involve handling the devices as singulated units.

Unfortunately, a conventional test/burn-in socket for a singulated package has inherent physical limitations that cause problems in a testing/burn-in process. The method of testing and burn-in of packages 108 is time consuming because numerous packages 108 must be individually loaded and unloaded. The method of testing and burn-in can also potentially create contact terminal defects, such as bending and causing coplanarity problems to the leads 107.

SUMMARY OF THE INVENTION

What is needed is a method of testing packages that overcomes the inherent limitations of a conventional test/burn-in socket. Broadly speaking, the present invention fills these needs by providing a method of using a strip socket for testing and burn-in of strip base packages. It should be appreciated that the present invention can be implemented in numerous ways, including as a method, a process, an apparatus, a system or a device. Inventive embodiments of the present invention are summarized below.

In one embodiment, a method of processing semiconductor devices using a strip socket is provided. The method includes the steps of assembling the semiconductor devices into a strip, isolating a portion of each of the semiconductor devices in the strip, and performing operations on the semiconductor devices in the strip using a strip socket. The strip socket is designed to make electrical contact substantially simultaneously with each semiconductor device in the strip.

In another embodiment, a strip socket is provided. The strip socket is designed to make electrical contact with semiconductors devices in a strip. The electrical contact is made substantially simultaneously with each of the semiconductor devices in the strip. A user can load each of semiconductor devices of the strip into the strip socket at substantially a same time. A user can also unload each of semiconductor devices of the strip from the strip socket at substantially a same time.

In yet another embodiment, a strip of semiconductor devices is provided. The strip of semiconductor devices is designed to make electrical contact with a strip socket, wherein electrical contact of each of the semiconductors devices is designed to be made at substantially a same time with the strip socket.

The invention encompasses other embodiments as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 1A (Prior Art) is a conventional test/burn-in socket for a singulated semiconductor package;

FIG. 1B (Prior Art) is a cross-sectional view of the conventional test/burn-in socket of FIG. 1A (Prior Art);

FIG. 1C (Prior Art) is a conventional test/burn-in board, including multiple test or burn-in sockets;

FIG. 6A is a diagram of a testing/burn-in strip socket of a leaded package, in accordance with an embodiment of the present invention;

FIG. 6B is a diagram of a testing/burn-in strip socket of a leadless package, in accordance with an embodiment of the present invention;

FIG. 7A (Prior Art) is a flowchart of a process involving conventional testing/burn-in.

DETAILED DESCRIPTION OF THE PREFERRED EMBODIMENT(S)

An invention for a method of using a strip socket for testing and burn-in of strip base packages is disclosed. Numerous specific details are set forth to provide a thorough understanding of the present invention. However, it will be understood, to one skilled in the art, that the present invention can be practiced with other specific details.

An important purpose of the present invention is to enable a testing/burn-in method that utilizes a strip socket. A strip socket is a socket that allows substantially simultaneous electrical contact to multiple packages in strip format. The method involves performing electrical isolation of the lead or terminal of each device in the same strip.

Figure 2B:
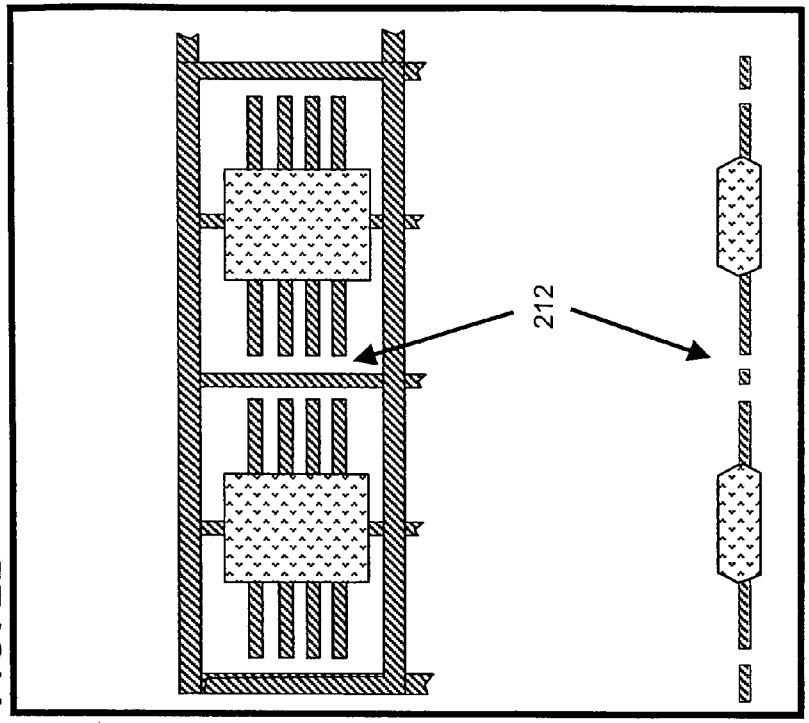
FIG. 2B is a schematic diagram showing lead/terminal isolation for a leaded package after the lead length cut, in accordance with an embodiment of the present invention.
Figure 2A:
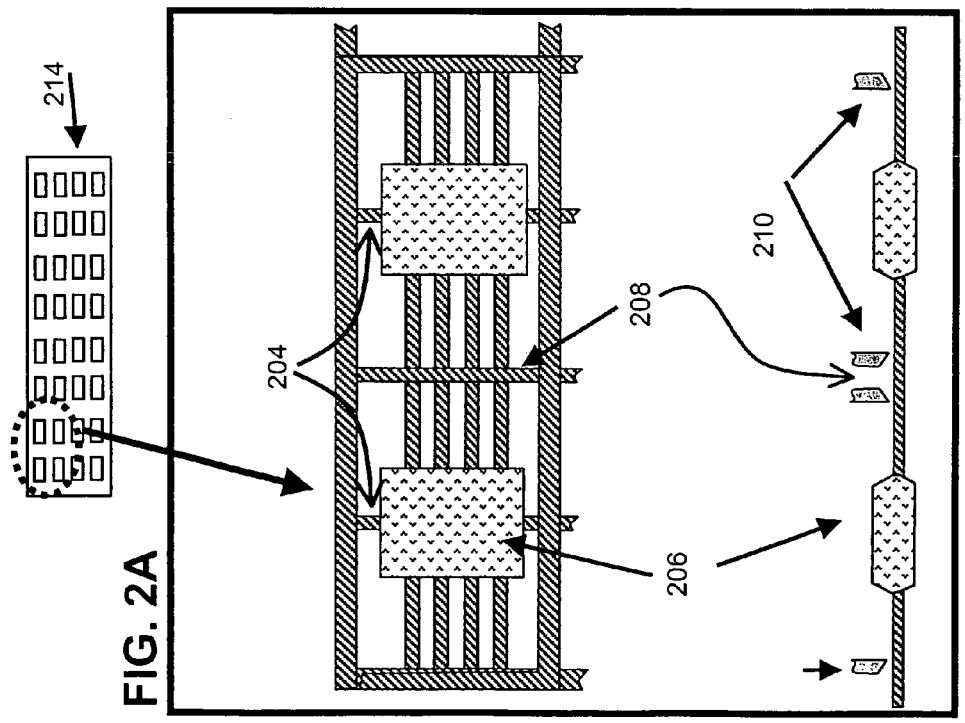
FIG. 2A is a schematic diagram showing lead/terminal isolation for a leaded package before a lead length cut, in accordance with an embodiment of the present invention.

FIG. 2A is a schematic diagram showing lead/terminal isolation for a leaded package before a lead length cut, in accordance with an embodiment of the present invention. Examples of a leaded package include a surface mount device and a through-hole package. FIG. 2A shows a portion of a semiconductor lead frame strip 214. The lead frame strip 214 is a matrix of semiconductor units. The lead frame strip 214 is tied together with tie bars 204 and lead tie bars 208. The lead frame strip 214 can also include any substrate appropriate for manufacturing the matrix. The lead frame strip 214 holds each package body 206. For a surface mount or through-hole package, a mechanical punching or trimming can be applied to electrically isolate the package 206 while the package 206 is held in the same strip with a tie bar or an extrusion of molded compound. A portion of a cutting puncher 210 is in position to cut the lead frame and cause electrical isolation of the packages 206. This technique is called lead length cut.

FIG. 2B is a schematic diagram showing lead/terminal isolation for a leaded package after the lead length cut, in accordance with an embodiment of the present invention. The lead tips 212 have been cut and electrically isolated from an adjacent package 206 by the cutting puncher 210.

Figure 3B:
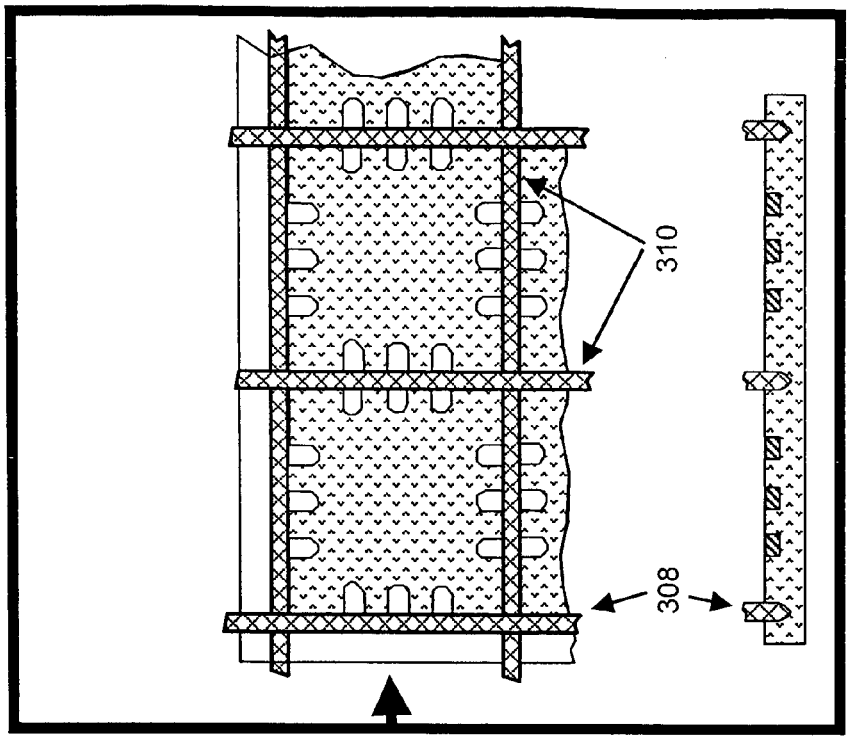
FIG. 3B is a schematic diagram of terminal isolation after isolation for a leadless package, in accordance with an embodiment of the present invention.
Figure 3A:
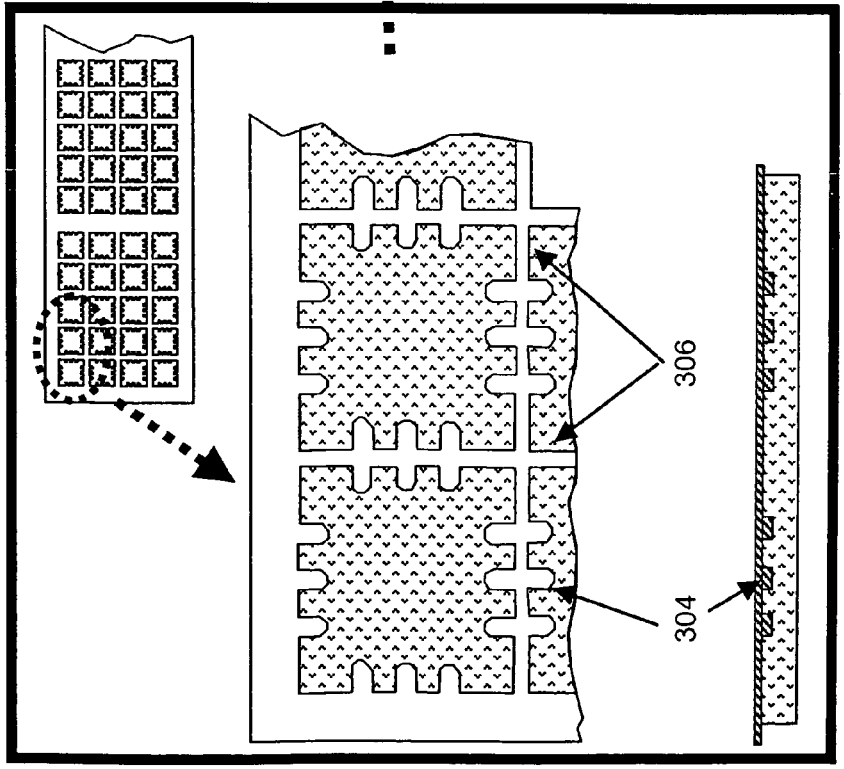
FIG. 3A is a schematic diagram of terminal isolation before isolation for a leadless package, in accordance with an embodiment of the present invention.

FIG. 3A is a schematic diagram of terminal isolation before isolation for a leadless package, in accordance with an embodiment of the present invention. Before isolation, the terminals 304 of each package are connected to their respective tie bar 306. For a leadless semiconductor package, such as a quad flat non-lead (QFN) package, its leads or terminals are normally connected to the tie bar and are thus shorted together in the same package and on adjacent packages. Accordingly, an electrical function nor electrical function test can not be performed. The isolation described above can be caused by using a mechanical rounder, a sawing blade, a laser, a water jet, a chemical etchant or by using another technique designed to disconnect the lead or terminal out of a common tie bar while each device is held in the strip.

FIG. 3B is a schematic diagram of terminal isolation after isolation for a leadless package, in accordance with an embodiment of the present invention. After isolation, terminals of each package are isolated and ready for electrical testing in the strip socket. A saw path 308 is shown. Preferably, the saw path 308 does not fully sever the package material to allow the electrically isolated packages to remain in a strip. A removed tie bar 310 is shown where a half cut or partial cut removed a tie bar 306.

Figure 4:
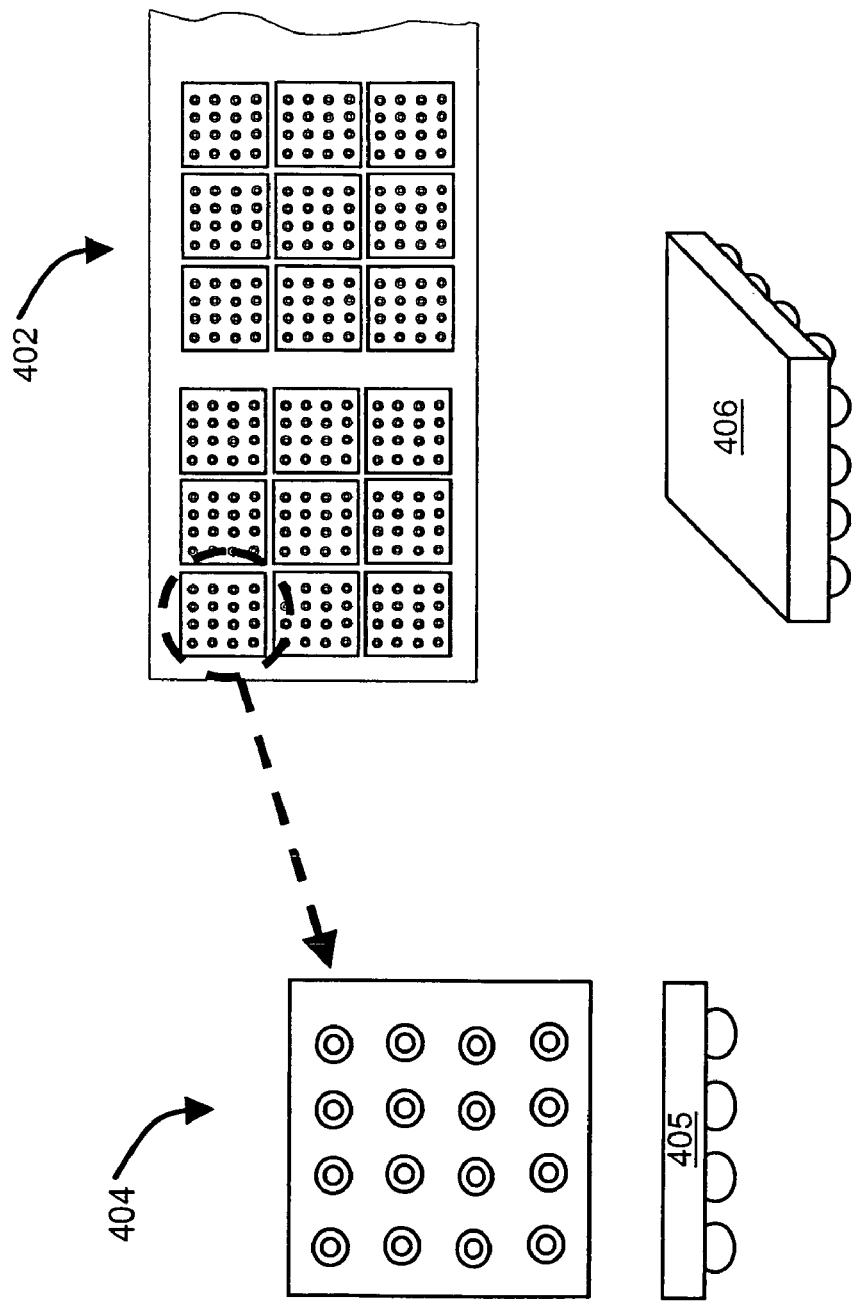
FIG. 4 is a diagram of a strip of ball grid arrays (BGA) or chip scale packages (CSP), in accordance with an embodiment of the present invention.

FIG. 4 is a diagram of a strip 402 of ball grid arrays (BGA) or chip scale packages (CSP), in accordance with an embodiment of the present invention. A top view 404 and a cross-sectional view 405 are shown for the BGA/CSP package 406. The BGA/CSP package 406 has leads or terminals that are already electrically isolated by design or by assembly processing. Thus, neither a BGA nor a CSP require further isolation processing.

Figure 5:
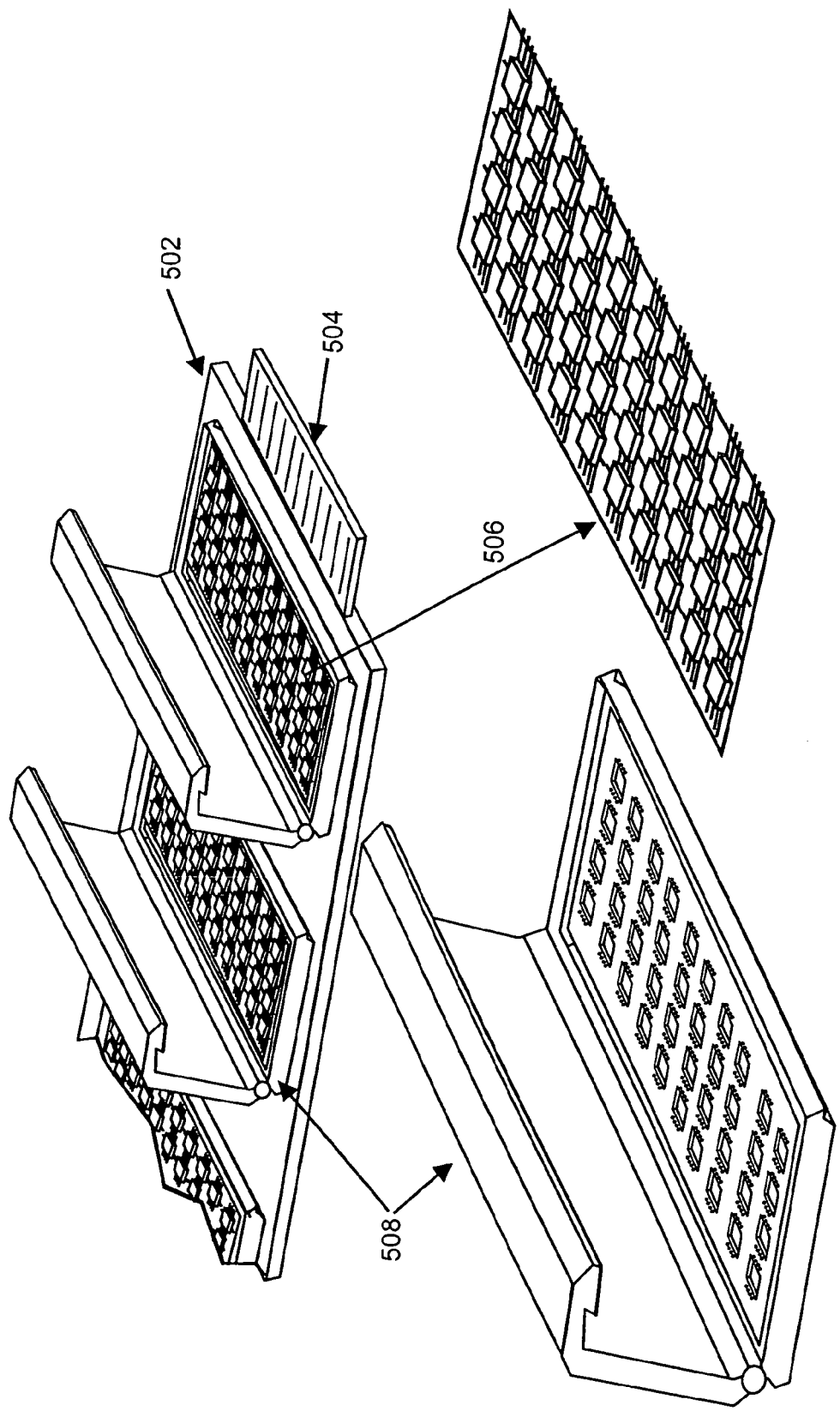
FIG. 5 is a diagram of strip sockets on a testing/burn-in board, in accordance with an embodiment of the present invention.

FIG. 5 is a diagram of strip sockets on a testing/burn-in board, in accordance with an embodiment of the present invention. Each strip socket 508 accommodates a whole strip 506 of packages. In other words, one whole strip 506 of packages can be placed into each strip socket 508. The strip sockets 508 are mounted to a testing/burn-in board 502. A card edge connector 504 integrally formed in an edge is mounted to the testing/burn-in board 502 for electrically coupling the testing/burn-in board to a test or burn-in system. The strip socket 508 minimizes the number of devices that need to be handled by handling multiple devices as a strip. All units or packages in the strip socket 508 are loaded and unloaded at substantially the same time.

FIG. 6A is a diagram of a testing/burn-in strip socket of a leaded package (e.g., a surface mount device or through-hole package), in accordance with an embodiment of the present invention. The strip socket of leaded packages 206 includes a cover 604 and a base 608 mounted to a PCB 502. Another name for the base 608 is cavity. Multiple leaded packages 206 or leaded devices are shown undergoing testing and/or burn in at once. Each leaded package 206 has a plurality of leads 214, which are electrically coupled with the contact pins 606. A lock 610 fixes the cover 604 to the base 608. The lead 214 is preferably not formed into a certain shape here. Rather, the leads 214 preferably remain substantially flat. Further, preferably only the tip of the lead 214 is cut and isolated. The forming of the lead 214 are preferably processed after a test or burn-in. Thus, loading or unloading of the package strip into the strip socket does not affect the shape of the lead 214.

FIG. 6B is a diagram of a testing/burn-in strip socket of a leadless package, in accordance with an embodiment of the present invention. The strip socket of a leadless package includes a cover 612 and a base 622 mounted to a PCB 620. Multiple leadless packages 614 or leadless devices are shown undergoing testing at once. As is known, each leadless package 614 has no leads. The leadless packages 614 have terminals 616, which are isolated from other semiconductor devices in the strip. Contact pins 618 electrically connect the terminals 616 to the PCB 620. A lock 624 fixes the cover 612 to the base 622.

Note that a strip socket for a BGA package 406 is not displayed. A similar method and apparatus used for leaded packages and leadless packages can be applied to BGA packages 406.

Figure 7A:
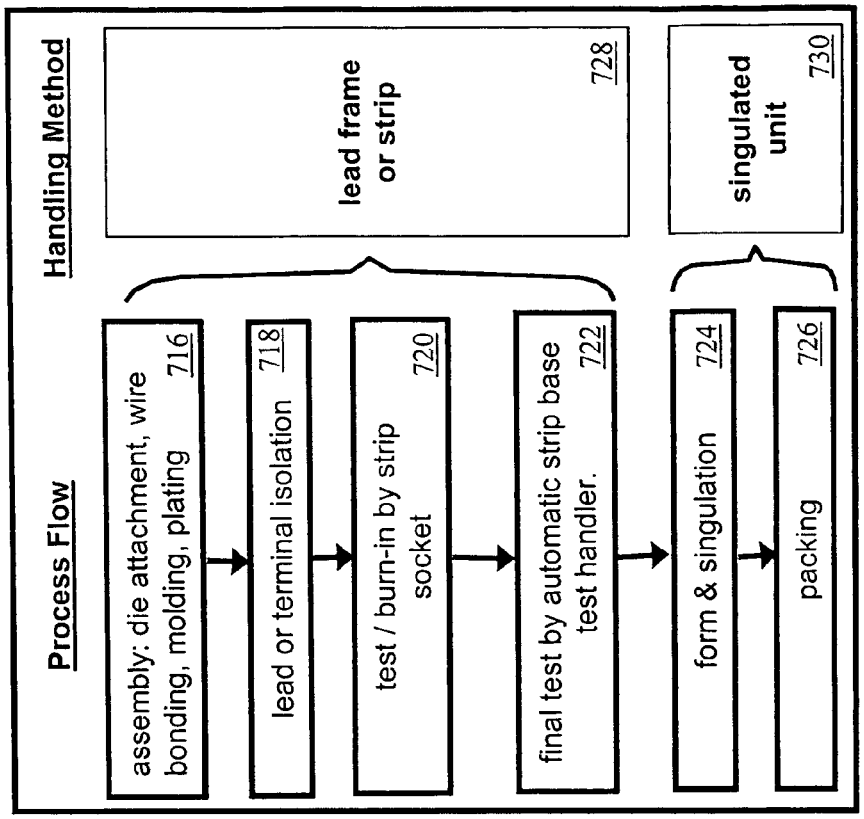
Figure 7B:
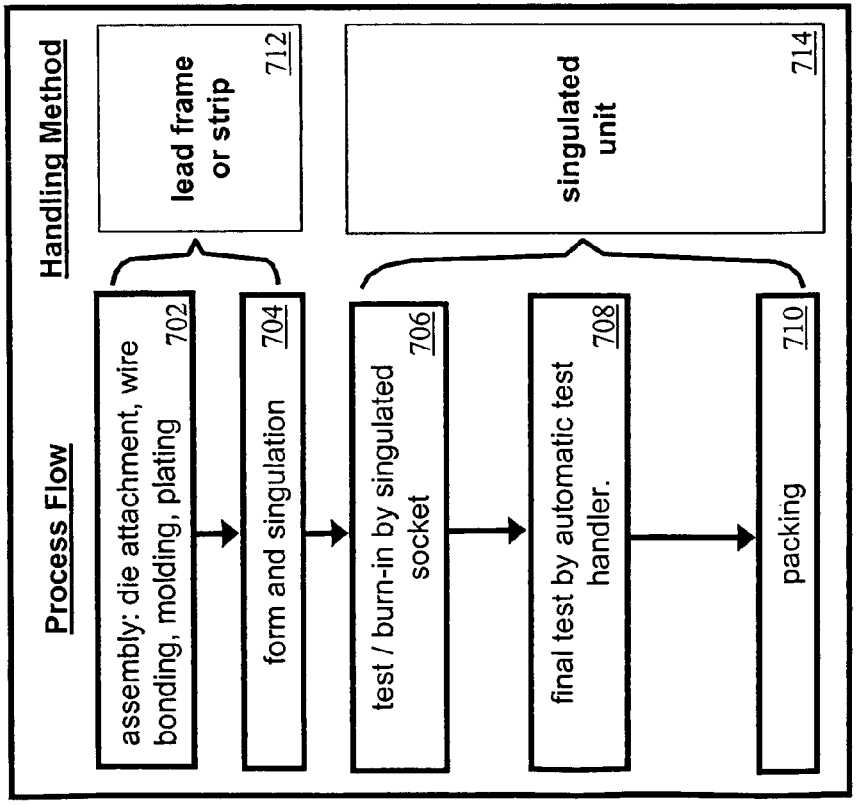
FIG. 7B is flowchart of a process involving testing/burn-in utilizing a strip socket, in accordance with an embodiment of the present invention.

FIG. 7B is a flowchart of a process involving testing/burn-in utilizing a strip socket, in accordance with an embodiment of the present invention. The purpose is to reduce the number of separate devices that must be handled to simplify the process of assembly, testing and packing of the semiconductor devices. By reducing handling requirements, the time for manufacturing will be reduced. The process involves handling semiconductor packages from assembly to final testing utilizing strip sockets 508. The process flow begins in the operation 716, which involves assembly of semiconductor chips into packages. Assembly includes die attachment, wire bonding, plating and molding, among other things. The process flow proceeds to the operation 718 which includes lead or terminal isolation. Next, the strip of semiconductor devices is loaded into the strip socket. The physical natures of the strip and the strip socket allow a manufacturer to load each of the semiconductor devices of the strip into the strip socket at substantially a same time. Test/burn-in using a strip socket is then performed on all the devices in the strips in the operation 720. In the operation 722, final testing by an automatic base test handler is performed. The strip of semiconductor devices can then be unloaded from the strip socket. The physical natures of the strip and the strip socket allow a manufacturer to unload all of the semiconductor devices of the strip from the strip socket at substantially a same time. Then, in the operation 724, the packages undergo forming and singulating. Next, packing is performed in the operation 726. As shown in FIG. 7B, the operations 716, 718, 720 and 722 involve handling the packages as lead frames or strips. Only the operations 724 and 726 involve handling the packages as singulated units. The process of FIG. 7B is preferably handled in a temperature range of −65° C. to 185° C.

Advantageously, the strip socket of the present invention significantly reduces mechanical lead defects in test/burn-in processing. Time is dramatically saved during loading and unloading of the packages on the testing/burn-in board. Further, processing is substantially simplified by handling the packages in a strip format from assembly to final testing.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A strip socket, for making electrical contact with packaged semiconductor devices mounted on a leadframe strip, each packaged semiconductor device having a bottom surface comprising a first end and a second end opposite the first end, the strip socket comprising a base configured to conformably accept the packaged semiconductor devices, wherein electrical contact with each of the packaged semiconductor devices of the strip is made at substantially a same time, wherein the base comprises a recessed portion for each individual packaged semiconductor device, wherein each recessed portion of the base is material that extends across the bottom surface of the corresponding packaged semiconductor device from the first end to the second end, and wherein the base and the leadframe strip are aligned by the conformable acceptance of the base.

2. The strip socket of claim 1, wherein the strip socket is designed to be loaded with each of the semiconductor devices in the strip at substantially a same time.

3. The strip socket of claim 1, wherein the strip socket is designed to be unloaded of each of the semiconductor devices in the strip at substantially a same time.

4. The strip socket of claim 1, wherein the strip socket is designed to facilitate testing of semiconductor devices mounted on the leadframe strip.

5. The strip socket of claim 1, wherein the strip socket is designed to facilitate burn-in of semiconductor devices mounted on the leadframe strip.

6. The strip socket of claim 1, wherein the base comprises a bottom surface on an opposite side of the base from the recessed portions, and the base is mounted to a printed circuit board along the bottom surface of the base.

\* \* \* \* \*